United States Patent

Bemmerl et al.

(10) Patent No.: US 8,848,297 B2
(45) Date of Patent: Sep. 30, 2014

(54) LENS, OPTOELECTRONIC COMPONENT COMPRISING A LENS AND METHOD FOR PRODUCING A LENS

(75) Inventors: Thomas Bemmerl, Schwandorf (DE); Ulrich Streppel, Regensburg (DE); Bert Braune, Wenzenbach (DE)

(73) Assignee: OSRAM Opto Semiconductors GmbH (DE)

( * ) Notice: Subject to any disclaimer, the term of this patent is extended or adjusted under 35 U.S.C. 154(b) by 91 days.

(21) Appl. No.: 13/263,104

(22) PCT Filed: Mar. 5, 2010

(86) PCT No.: PCT/DE2010/000251
§ 371 (c)(1), (2), (4) Date: Nov. 8, 2011

(87) PCT Pub. No.: WO2010/118718
PCT Pub. Date: Oct. 21, 2010

(65) Prior Publication Data
US 2012/0162783 A1 Jun. 28, 2012

(30) Foreign Application Priority Data
Apr. 17, 2009 (DE) .................. 10 2009 017 946

(51) Int. Cl.
| | |
|---|---|
| G02B 3/00 | (2006.01) |
| G02B 19/00 | (2006.01) |
| H01L 33/58 | (2010.01) |
| G02B 5/02 | (2006.01) |
| G02B 3/04 | (2006.01) |
| F21Y 101/02 | (2006.01) |
| F21V 5/04 | (2006.01) |

(52) U.S. Cl.
CPC .............. *G02B 3/00* (2013.01); *G02B 19/0014* (2013.01); *H01L 33/58* (2013.01); *G02B 5/02* (2013.01); *G02B 5/0278* (2013.01); *H01L 2933/0091* (2013.01); *G02B 3/04* (2013.01); *G02B 19/0061* (2013.01); *F21Y 2101/02* (2013.01); *F21V 5/04* (2013.01); *Y10S 362/80* (2013.01)
USPC ............................ 359/707; 362/335; 362/800

(58) Field of Classification Search
CPC .............................. G02B 3/00; G02B 5/0242
USPC ......... 362/311.02, 235–249.02, 800; 359/707, 359/722, 723, 581; 356/515, 239.2
See application file for complete search history.

(56) References Cited

U.S. PATENT DOCUMENTS

| | | |
|---|---|---|
| 3,875,456 A | 4/1975 | Kano et al. |
| 4,603,496 A | 8/1986 | Latz et al. |

(Continued)

FOREIGN PATENT DOCUMENTS

| | | |
|---|---|---|
| CN | 1945868 | 4/2007 |
| CN | 1989450 | 6/2007 |

(Continued)

OTHER PUBLICATIONS

Leermakers, Peter A., Harold T. Thomas, Lawrence D. Weis, and F. Colin James. "Spectra and Photochemistry of Molecules Adsorbed on Silica Gel. IV." (1966).*

(Continued)

*Primary Examiner* — Diane Lee
*Assistant Examiner* — Gerald J Sufleta, II
(74) *Attorney, Agent, or Firm* — DLA Piper LLP (US)

(57) ABSTRACT

A lens includes a main body and a potting material. The main body includes a first major face, a second major face and at least one cavity arranged on the first major face. The potting material is arranged in the cavity and includes at least one diffuser which scatters radiation of at least one wavelength range.

13 Claims, 3 Drawing Sheets

(56) References Cited

U.S. PATENT DOCUMENTS

| | | | |
|---|---|---|---|
| 5,140,220 | A | 8/1992 | Hasegawa |
| 6,654,174 | B1 * | 11/2003 | Huang .................. 359/619 |
| 6,940,644 | B2 * | 9/2005 | Honda et al. ............. 359/453 |
| 7,441,929 | B2 * | 10/2008 | Stefanov et al. ........... 362/336 |
| 7,719,636 | B2 * | 5/2010 | Kim et al. .................. 349/95 |
| 8,353,616 | B2 * | 1/2013 | Cennini et al. ............. 362/619 |
| 2003/0112523 | A1 | 6/2003 | Daniell |
| 2003/0179584 | A1 | 9/2003 | Pond et al. |
| 2003/0230751 | A1 | 12/2003 | Harada |
| 2006/0012297 | A1 | 1/2006 | Lee et al. |
| 2007/0019416 | A1 * | 1/2007 | Han et al. .................. 362/307 |
| 2007/0264492 | A1 | 11/2007 | Mizuno et al. |
| 2007/0268694 | A1 | 11/2007 | Bailey et al. |
| 2008/0231772 | A1 | 9/2008 | Hung |
| 2009/0016051 | A1 | 1/2009 | Wood |
| 2011/0188244 | A1 * | 8/2011 | Hong et al. ................ 362/235 |
| 2011/0211345 | A1 * | 9/2011 | De Boer et al. ............. 362/235 |

FOREIGN PATENT DOCUMENTS

| | | |
|---|---|---|
| CN | 20115494 | 11/2008 |
| CN | 201152494 | 11/2008 |
| DE | 10 051 464 | 5/2002 |
| DE | 10 2008 025 756 A1 | 12/2009 |
| EP | 0 362 993 A2 | 4/1990 |
| EP | 2 009 348 A2 | 12/2008 |
| EP | 2 056 016 A1 | 5/2009 |
| TW | 562954 | 11/2003 |
| TW | 2009/03862 | 1/2009 |
| WO | 2008/156518 | 12/2008 |

OTHER PUBLICATIONS

Nakamura, Toshitaka. "Enhanced Coupling of Light from Organic Electroluminescent Device Using Diffusive Particle Dispersed High Refractive Index Resin Substrate." Optical Review 13.2 (2006): 104-10. Print.*

* cited by examiner

LENS, OPTOELECTRONIC COMPONENT COMPRISING A LENS AND METHOD FOR PRODUCING A LENS

RELATED APPLICATIONS

This is a §371 of International Application No. PCT/DE2010/000251, with an international filing date of Mar. 5, 2010 (WO 2010/118718, published Oct. 21, 2010), which is based on German Patent Application No. 10 2009 017 946.1, filed Apr. 17, 2009, the subject matter of which is incorporated by reference.

TECHNICAL FIELD

This disclosure relates to a lens with a main body, to an optoelectronic component with a light source and such a lens and to a method for producing such a lens.

BACKGROUND

When an LED chip is combined with a lens, in particular in the case of white LED chips which comprise a chip and a converter, it may happen that, when switched off, the LED chip is visible to an observer, in particular appearing yellow, as a result of the converter. In specific intended applications, this effect is not desired and should advantageously be avoided while nevertheless still ensuring the emission of the LED chips when switched on.

It could therefore be helpful to provide an improved lens which meets the above-stated requirements. It could furthermore be helpful to provide an optoelectronic component which exhibits improved emission characteristics, in particular a homogeneous overall impression. It could still further be helpful to provide a method for producing a lens with an improved homogeneous overall impression.

SUMMARY

We provide a lens including a main body including a first major face, a second major face and at least one cavity arranged on the first major face, and a potting material arranged in the cavity and including at least one diffuser which scatters radiation of at least one wavelength range.

We also provide an optoelectronic component including at least one lens, and at least one light source arranged on a side of the first major face.

We further provide a method for producing the lens, wherein the potting material is introduced into the cavity by a dispensing system.

DETAILED DESCRIPTION

We provide a lens which comprises a main body and a potting material. The main body comprises a first major face, a second major face and at least one cavity arranged on the first major face. The potting material is arranged in the cavity of the main body and comprises at least one diffuser which scatters the radiation of at least one wavelength range.

The lens, in particular, comprises at least two sub-zones: the main body and the cavity with potting material arranged therein.

The main body exhibits a lens shape which enables guidance of radiation which enters the lens. The main body is, for example, constructed in the manner of a convergent lens or a Fresnel lens.

The main body preferably does not comprise a diffuser such that radiation which enters the main body is guided in the main body without undergoing scattering processes.

Radiation which enters the potting material, on the other hand, is scattered on the diffuser. Radiation is preferably diffusely scattered on the diffuser.

The lens accordingly comprises at least two sub-zones which differ in particular with regard to the degree of scatter of the material. As a result, at least two beam paths which differ with regard to the number of scattering processes are made possible in the lens. The homogeneous optical appearance of the lens may accordingly be adapted to lens design requirements depending on the specific arrangement of the cavity in the main body. Optical outcoupling losses are advantageously minimized while emission characteristics are retained.

Due to the at least two sub-zones, such a lens accordingly comprises at least two light paths which differ, in particular, on the basis of the scattering processes. It is thus advantageously possible to obtain a lens which comprises zones having different properties with regard to scattering and refraction.

The volume fraction of the lens which comprises a diffuser may furthermore be minimized. In particular, it is not absolutely necessary for the entire main body to comprise a diffuser, but rather only the potting material in the lens, in particular, directly above the light source, in which this requirement is desired.

The cavity is preferably completely filled by the potting material. In particular, the potting material preferably ends flush with the first major face of the main body. Preferably, no elevations or indentations are formed between the potting material and first major face. The first major face of the main body merges seamlessly into and flush with the surface of the potting material remote from the main body. A continuous boundary surface between lens and surrounding medium, which in particular comprises no nonuniformities in the transition between potting material and main body, may thus advantageously be achieved.

Alternatively, the surface of the potting material remote from the main body may be curved, in particular, may exhibit a concave or convex curvature. In this case, a nonuniformity, for example, a step, may occur in the transition between the potting material and main body. In this case, it is not absolutely necessary for the potting material to end flush with the first major face of the main body.

The proportion of the lens made up by the potting material preferably amounts to no more than 20%, preferably no more than 10%, particularly preferably no more than 5%. The proportion of the lens made up by main body thus preferably amounts to more than 80%, preferably more than 90%, particularly preferably more than 95%.

The potting material may be epoxy resin. The main body of the lens preferably comprises silicone, epoxide or a mixture of silicone and epoxide. Alternatively, the main body may contain thermoplastic or thermoset materials, such as, for example, PMMA (PMMA: polymathyl methacrylate) or PC (PC: polycarbonate). In this case, the main body may advantageously be produced by an injection molding process.

The refractive index of the material of the main body is preferably similar to the refractive index of the potting material.

In particular, the refractive index of the material of the main body differs from the refractive index of the potting material by no more than 10%. It is additionally possible for the main body and the potting material to contain the same material. As a result of a similar or even identical refractive index of the material of the main body and of the potting material, incident radiation is not or is scarcely refracted or reflected at the boundary surface between main body and potting material. Advantageously, radiation may thus be guided purposefully in the lens.

The potting material and the main body are preferably in direct contact. In particular, the main body and the potting material directly adjoin one another and there is no space or gap at the boundary surface between main body and potting material.

Preferably, the first major face exhibits a curvature at least in places. In particular, the first major face is not planar. For example, the first major face exhibits a concave curvature or a convex curvature. For example, the first major face is curved in places.

Further, the second major face may comprise outcoupling structures. The outcoupling structures are, for example, roughened portions of the second major face.

As a result of the roughened portion of the second major face, radiation which passes through the lens may be scattered on emerging from the lens at the second major face. Radiation is preferably diffusely scattered at the roughened portion of the second major face. As a consequence, radiation which is guided by such a lens exhibits improved, in particular, homogeneous, emission characteristics on emerging from the lens.

Preferably, the main body comprises at least one reflective sub-zone.

Preferably, the main body comprises two reflective sub-zones. The two reflective sub-zones are preferably arranged on the first major face and are at a distance from the cavity. The reflective sub-zone of the main body may, in particular, be a projection which has a shape such that radiation which enters the reflective sub-zone is reflected, for example, at a boundary surface of the reflective sub-zone. Alternatively, the reflective sub-zone may comprise surfaces which are coated with a reflective material.

Preferably, the main body is constructed at least in places in the manner of a Fresnel lens. A Fresnel lens comprises a plurality of steps, in particular on one of the major faces. The first major face preferably comprises the plurality of steps. The first step of the Fresnel lens particularly preferably forms the cavity of the main body.

The first step of the Fresnel lens is, in particular, the midmost step on the first major face of the lens.

Preferably, the main body comprises at least one further cavity arranged on the first major face and contains a potting material which comprises at least one diffuser. The number of further cavities with potting material contained therein is preferably determined on the basis of the particular requirement and/or application of the lens. It is accordingly advantageously possible selectively to impart diffusion properties to any desired lens areas depending on predetermined lens homogeneity and design requirements.

Further preferably, the main body contains at least one converter. The converter, in particular, converts light of one wavelength into light of another wavelength. For example, the converter at least partially converts blue radiation into yellow radiation, which then mixes with the blue radiation and enables white mixed radiation.

An optoelectronic component is furthermore provided which comprises at least one lens and at least one light source, the light source being arranged on the side of the first major face. The lens of the optoelectronic component is here constructed as disclosed in conjunction with one of the above-described examples. In other words, all features disclosed in conjunction with the lens are also disclosed for the lens of the optoelectronic component and vice versa.

The light source is, in particular, arranged on the side of the first major face. The first major face thus forms a radiation entrance face for radiation emitted by the light source. The second major face of the lens forms a radiation exit face for the radiation emitted by the light source and guided through the lens. The radiation entrance face accordingly comprises the cavity with potting material contained therein.

In particular, the potting material containing the diffuser is arranged upstream of the main body such that radiation which passes through the potting material is then guided into the main body. The potting material is thus arranged between the light source and main body. Scattering processes involving the radiation emitted by the light source thus take place before entry into the main body, and thus before the light is guided in the lens.

The optoelectronic component described here is based inter alia on the recognition that the emission characteristics of components in combination with a transparent lens exhibit troublesome intensity peaks in spatial emission. To avoid such troublesome intensity peaks, the component makes use of the idea of combining a potting material containing diffuser with a transparent main body. As a result of omnidirectional scattering of the radiation on the diffuser, the troublesome intensity peaks in the emission characteristics are advantageously avoided. As a result of scattering of the emitted radiation on the diffuser, color homogeneity is furthermore improved and the intensity of the electromagnetic radiation smoothed.

Color homogeneity is, in particular, color location stability over the spatial emission through the surface of the component.

In particular, it is possible thanks to such a lens to avoid the effect that, when the component is switched off, the light source is visible to an observer, in particular, appearing yellow. This effect, in particular, occurs with white-emitting LED chips which comprise a chip and a converter. The component comprising a lens and a light source is accordingly constructed such that the light source, in particular a white-emitting LED chip, is not visible when the component is switched off.

Such a lens simultaneously satisfies the requirement of continuing to ensure emission when the LED chip is switched on. These advantages are, in particular, ensured by the potting material containing diffuser which is introduced into the cavity of the main body.

Because the cavity is arranged on the light source side, the potting material is not arranged on the outside of the component. As a consequence, the potting material with the diffuser contained therein is advantageously protected from mechanical and/or chemical influences. Mechanical and/or chemical influences include, for example, impact, penetration of liquid into the potting material or scratching of the potting material.

The light source is preferably arranged directly opposite the cavity of the main body. The lateral extent of the cavity is preferably less than or equal to the lateral extent of the light source.

The lateral extent is, in particular, that extent which extends along the first major face.

Thanks to a directly opposite arrangement and such a lateral extent relative one another, it is, in particular, possible to avoid "hotspots" in the emission characteristics of the component. Homogeneous emission characteristics are advantageously made possible.

In a preferred component, the light source is arranged outside the cavity of the main body. In particular, the light source is arranged at a distance from the lens.

Alternatively, the light source may be arranged within the cavity of the main body. In this case, the potting material completely encloses the light source.

The light source is preferably a light-emitting diode (LED).

A method for producing a lens is additionally provided. It is thus possible to produce a lens as disclosed in conjunction with one of the above-described examples. In other words, all features disclosed in conjunction with the lens or the component are also disclosed for the method and vice versa.

The potting material may be introduced into the cavity using a dispensing system. The potting material is introduced to this end in droplet form. A syringe or a pipette is, for example, used for this purpose.

The diffuser is preferably mixed with the potting material before the potting material is introduced into the cavity. The diffuser is preferably distributed in the potting material such that the concentration of the diffuser in the potting material is uniformly distributed. In this way it is, in particular, possible to achieve isotropic scattering of radiation which impinges on and penetrates into the potting material.

The temperature of the potting material in the dispensing method step may be below the melting temperature of the material of the main body. In this way it is possible to avoid damaging or even destroying the material of the main body during production the lens.

Further features, advantages, preferred developments and convenient aspects of the lens, of the optoelectronic component and of the production method are revealed by the examples explained below with reference to FIGS. 1 to 5.

Identical or equivalently acting components are in each case denoted with identical reference numerals. The components illustrated and the size ratios of the components to one another should not be regarded as to scale.

Figure 1:
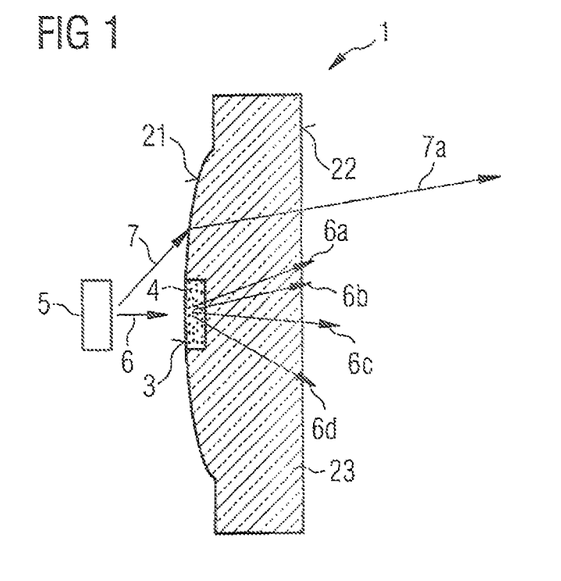
FIGS. 1 to 3 in each case show a schematic cross-section of an example of an optoelectronic component.

FIG. 1 shows a schematic cross-section of an optoelectronic component comprising a lens 1 and a light source 5. The lens 1 comprises a first major face 21 and a second major face 22. The light source 5 is, in particular, arranged upstream of the first major face 21. The first major face 21 is accordingly a radiation entrance face for radiation emitted by the light source 5. The second major face 22 is a radiation exit face for radiation emitted by the light source 5.

The light source 5 is preferably a semiconductor body and comprises an active layer. The active layer of the semiconductor body preferably comprises a pn-junction, a double heterostructure, a single quantum well (SQW) or a multi quantum well (MQW) for radiation generation. The term "quantum well structure" does not here have any meaning with regard to the dimensionality of the quantization. It thus encompasses inter alia quantum troughs, quantum wires and quantum dots and any combination of these structures.

The semiconductor body is preferably a light-emitting diode chip, in particular, a light-emitting diode. The semiconductor body is preferably a thin-film semiconductor body. A thin-film semiconductor body is considered to be a semiconductor body from which, during the production thereof, the growth substrate, on which a semiconductor layer sequence comprising the semiconductor body was grown, for example, epitaxially, has been removed.

The layers of the semiconductor body are preferably based on a III-V compound semiconductor material. A III-V compound semiconductor material comprises at least one element from main group III, such as, for example, Al, Ga, In, and one element from main group V, such as, for example, B, N, P, As. In particular, the term "III-V compound semiconductor material" encompasses the group of binary, ternary and quaternary compounds which contain at least one element from main group III and at least one element from main group V, in particular, nitride and phosphide compound semiconductors. Such a binary, ternary and quaternary compound may moreover comprise, for example, one or more dopants and additional components.

The light source 5 furthermore comprises a radiation exit side, through which the radiation generated in the light source may leave the light source 5. The radiation exit side of the light source 5, in particular, faces towards the radiation entrance face 21 of the lens. Preferably, no or scarcely any light emerges through the side faces of the light source 5.

The lens 1 comprises a main body 23, in which a cavity 3 is formed. The cavity 3 is arranged on the first major face 21 and, in particular, faces towards the light source 5.

The cavity 3 is preferably located directly opposite the radiation exit side of the light source 5. The lateral extent of the cavity 3 is particularly preferably less than or equal to the lateral extent of the light source 5.

A potting material 4 is arranged in the cavity, which material comprises at least one diffuser which scatters the radiation of at least one wavelength range. The diffuser, in particular, exhibits the property of scattering radiation emitted by the light source 5.

The light source 5 is preferably arranged outside the cavity 3 of the main body 23. The light source 5 is preferably arranged at a distance from the lens 1. The light source 5 is thus preferably not enclosed by the potting material 4, but is instead at a distance from the potting material 4. The lens 1 is, in particular, an independent component of the optoelectronic component and may preferably be produced separately.

The cavity 3 is preferably completely filled with the potting material 4. The filling level of the potting material 4 in the cavity 3 is accordingly adjusted such that, after curing of the potting material 4, the surface of the potting material 4 preferably ends flush with the surface of the main body 23, in particular with the first major face 21. No step or nonuniformity is thus formed at the edges of the transition between potting material 4 and main body 23, in particular between potting material 4 and first major face 21.

Thanks to a lens 1 which comprises a main body 23 and a potting material 4 containing diffuser therein, light guidance in the lens 1 is, in particular, improved. The emission characteristics of the component are, in particular, improved. A homogeneous appearance is advantageously made possible.

In particular, thanks to the lens 1 comprising a main body 23 and a potting material 4 with diffuser contained therein, the effect is avoided that, when the component is switched off, the light source 5 is visible to an observer, in particular appearing yellow. Simultaneously the lens 1 satisfies the requirement of continuing to ensure emission of the light source 5 when switched on, in particular of not shading the emitted radiation from the light source 5. The lens 1 thus exhibits the property that, when the component is switched off, the light source 5 is not visible to an observer, the lens 1 exhibiting radiation-transmissive properties for the radiation emitted by the light source 5 when the component is switched on while simultaneously improving the emission characteristics of the component.

In particular, thanks to its structure comprising main body 23 and potting material 4, the lens 1 may comprise various sub-zones which in each case enable different light paths. Radiation which enters the main body 23 of the lens 1 through the first major face 21 is guided without scattering processes in the lens 1 to the second major face 22 and may emerge from the lens 1 at the second major face 22. Radiation which enters the potting material 4 at the first major face 21 is scattered in the potting material 4, in particular on the diffuser arranged therein. Radiation is preferably diffusely scattered in the potting material 4. The radiation diffusely scattered in the potting material 4 is then guided in the main body 23 to the second major face 22, where it emerges from the lens 1.

Since the cavity with potting material 4 contained therein is arranged directly opposite the radiation exit side of the light source 5, it is possible, thanks to the diffuse scattering processes in the potting material 4, to reduce or even avoid hotspots in the emission characteristics of the component. In particular, thanks to the diffuse scattering, it is possible to enable a homogeneous distribution of the radiation which is emitted by the light source 5 and passes through the lens 1.

FIG. 1 shows two examples of possible beam paths. Radiation 7, which impinges on the first major face 21, enters the main body 23 at the first major face 21, is guided in the main body 23 to the second major face 22 without being scattered in the main body and leaves the lens 1 at the second major face 22. In particular, the radiation 7 does not pass through the potting material 4 and is therefore not scattered in the lens 1.

Radiation 6 which enters the potting material 4 at the first major face 21 is diffusely scattered on the diffuser in the potting material 4. The diffusely scattered radiation 6a, 6b, 6c, 6d emerges from the potting material 4 into the main body 23, where it is guided to the second major face 22 and emerges as diffusely scattered radiation 6a, 6b, 6c, 6d at the second major face 22.

The lens 1 accordingly comprises two light paths, one light path in which radiation is not subjected to any scattering processes and a second light path which leads through the cavity and the potting material 4 contained therein and undergoes scattering processes therein. In this way, it is possible to achieve homogeneous emission characteristics of the radiation which emerges from the lens 1. In particular, the lens 1 may be constructed by purposefully arranging the cavity 3 in the main body 23 such that it satisfies predetermined homogeneity and design requirements.

The main body 23 may, in particular, comprise a plurality of cavities 3 which in each case comprise a potting material 4 with a diffuser contained therein (not shown). Diffusion properties may consequently be selectively imparted to any desired lens areas depending on predetermined homogeneity requirements.

The potting material 4 is preferably epoxy resin. The main body 23 preferably comprises silicone, an epoxide or a mixture of silicone and epoxide. Alternatively, the main body 23 may contain at least one thermoplastic material, such as, for example, PMMA (PMMA: polymethyl methacrylate) or PC (PC: polycarbonate).

The refractive index of the material of the potting material 4 is preferably similar to the refractive index of the material of the main body 23. It is additionally possible for the potting material 4 and the main body 23 to contain the same material. As a consequence, the radiation emitted by the light source 5 is advantageously not refracted or reflected at the boundary surface between potting material 4 and main body 23. Optical outcoupling losses may advantageously be minimised in this manner.

Since the cavity 3 with potting material 4 contained therein is arranged on the side of the lens 1 facing towards the light source 5, the potting material 4 is not exposed to any mechanical and/or chemical stresses. Mechanical or chemical stresses should, in particular, be taken to mean mechanical or chemical environmental influences, such as, for example, moisture, impact and/or scratching.

Thanks to the arrangement of a potting material 4 with diffuser contained therein in a cavity of the lens 1, it is advantageously not absolutely necessary for the material of the main body 23 likewise to exhibit scattering characteristics. It is thus advantageously possible to minimize the proportion of the lens 1 which exhibits light-scattering characteristics.

The lens may furthermore comprise a converter for radiation conversion of the radiation emitted by the light source 5 (not shown). Emission of mixed radiation by the component, in particular emission of white light, is consequently made possible.

The first major face 21 is preferably curved or exhibits a curvature at least in places. In particular, the first major face 21 is of curved construction. For example, the first major face 21 may exhibit a curvature formed for use as a convergent lens. The curvature of the first major face 21 is, in particular, determined on the basis of the intended application of the lens 1.

Figure 2:
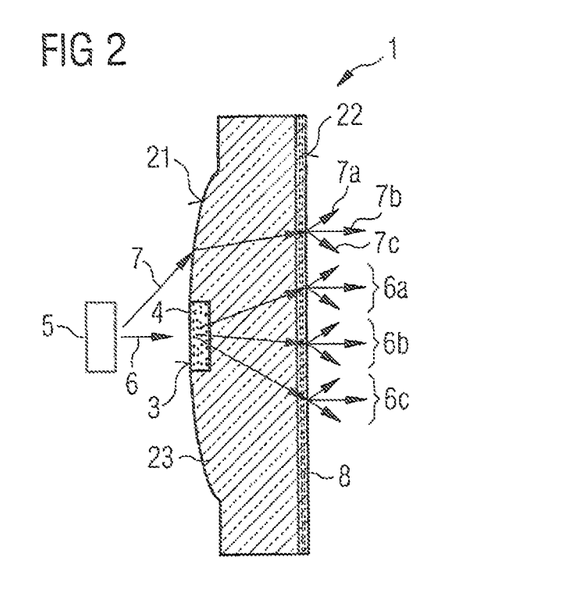

FIG. 2 differs from the example of FIG. 1 in that the second major face 22 comprises outcoupling structures. In particular, the second major face 22 comprises a roughened portion 8. Radiation emitted by the light source 5, which is guided in the lens 1, is diffusely scattered thereby before emerging from the lens 1 at the second major face 22. The emission characteristics of the component are further improved as a result. In particular, improved, homogeneous emission characteristics of the component are made possible in this manner.

Examples of possible beam paths through the lens 1 are shown as in FIG. 1 by arrows 6, 7, 6a, 6b, 6c, 7a, 7b, 7c.

The beam 7 which does not pass through the potting material 4, which beam is guided unscattered in the lens 1, is diffusely scattered at the second major face 22, in particular at the roughened portion 8, such that the beam 7 is divided into a plurality of scattered beams 7a, 7b, 7c. The beam 6 which passes through the potting material 4, which beam is scattered in the potting material 4 such that a plurality of scattered beams 6a, 6b, 6c are obtained even before the light is guided in the lens 1, is likewise in each case scattered at the roughened portion 8 such that the scattered beams 6a, 6b, 6c are in each case broken down into further scattered beams.

Radiation which thus does not pass through the potting material 4 is only diffusely scattered at the second major face 22. Radiation which does pass through the potting material 4, on the other hand, is scattered in the potting material 4, on the diffuser and at the second major face 22. Homogeneous emission characteristics of the radiation 6, 7 passing through the lens 1 are thus advantageously made possible.

Figure 3:
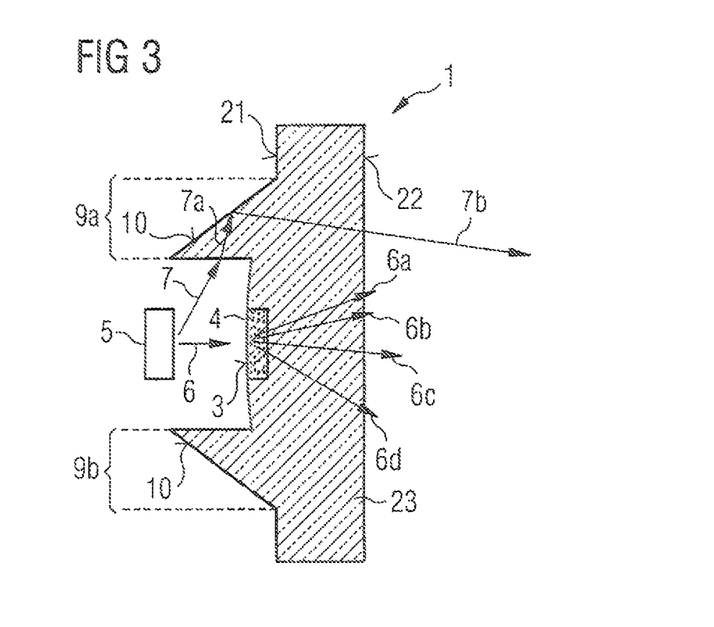

The example of FIG. 3 differs from the example of FIG. 1 in that the main body 23 comprises reflective sub-zones 9a, 9b. In particular, the reflective sub-zones 9a, 9b are arranged on the first major face 21 and at lateral distance from the cavity 3.

The lateral sub-zones 9a, 9b may preferably exhibit a height such that they enclose the light source 5.

Radiation emitted by the light source 5 may be reflected on the reflective sub-zones 9a, 9b such that the appearance, in particular the emission characteristics of the component are further improved.

Examples of possible beam paths are again indicated by arrows 6, 6a, 6b, 6c, 6d, 7, 7a, 7b.

For example, a beam 7 emitted by the light source 5 enters one of the reflective subzones 9a, is guided as a beam 7a in the reflective sub-zone 9a, impinges on the first major face 21, which, in particular, exhibits reflective properties, is reflected at this major face 21 such that the beam is guided towards the second major face 22 and emerges from the lens 1 at the second major face 22 as beam 7b. This beam 7 is accordingly not guided through the potting material 4 and thus does not undergo any scattering processes in the lens 1.

A beam 6 emitted by the light source 5, which beam enters the potting material 4 and does not pass through one of the reflective sub-zones 9a, 9b, on the other hand, is diffusely scattered on the diffuser as in the example of FIG. 1 and does not undergo any reflection processes.

The reflective properties of the reflective sub-zones 9a, 9b may be obtained, for example, by a reflective coating 10 applied to the first major face 21. Alternatively, reflection may be achieved by a refractive index difference between reflective sub-zones 9a, 9b and the surrounding medium.

Figure 4:
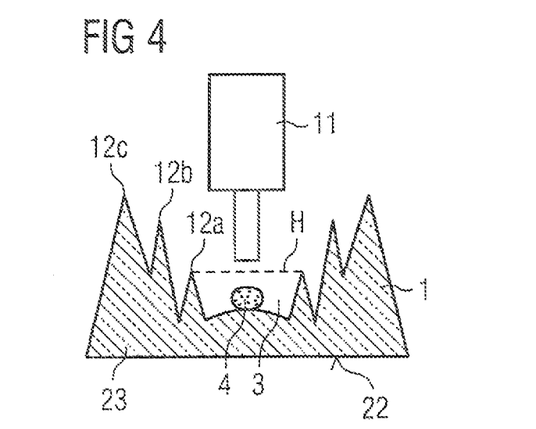
FIG. 4 shows a schematic cross-section of an example of a lens during the dispensing method step.

The example of FIG. 4 shows a cross-section of a lens 1 during the production process. In particular, the lens of the example of FIG. 4 is constructed in the manner of a Fresnel lens. A Fresnel lens, in particular, comprises a plurality of steps 12a, 12b, 12c on a major face, in this case the first major face 21. The second major face 22 can be planar.

The cavity of the main body 23 is preferably formed by the first step 12a of the Fresnel lens. The first step 12a of the Fresnel lens is, in particular, the midmost step the lens.

In particular, the first step 12a is of a height H which is filled with the potting material 4.

Alternatively, the filling level of the potting material 4 may be less than the height H of the first step 12a (not shown). In this case, the potting material 4 does not completely fill the height H of the first step 12a, such that radiation may be introduced into the Fresnel structure, in particular into the first step 12a, so advantageously contributing to improved efficiency of the optical system.

The potting material 4 is preferably introduced into the cavity using a dispensing system. To this end, the potting material 4 is, for example, introduced dropwise into the cavity 3. Dropwise introduction may, for example, be carried out by means of a syringe 11 or a pipette 11.

The temperature of the potting material 4 during the dispensing method step is preferably below the melting temperature of the material of the main body 23. The potting material 4 is then cured by cooling.

The potting material 4 may furthermore be introduced into the cavity 3 by means of a jetting process (not shown).

Figure 5A:
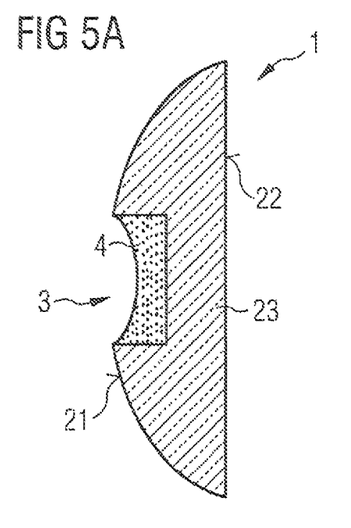
FIGS. 5A and 5B in each case show a schematic cross-section of an example of a lens.
Figure 5B:
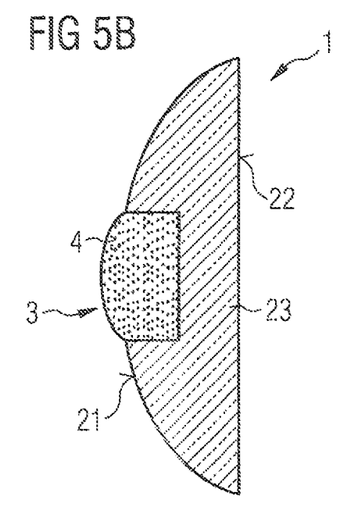

FIGS. 5A and 5B in each case show a lens 1 comprising a main body 23 and a potting material 4.

In contrast with the lens shown in FIG. 1, in the examples of FIGS. 5A and 5B the potting material 4 does not end flush with the first major face 21 of the main body 23. In particular, the surface of the potting material 4 remote from the main body 23 exhibits a curvature. For example, the surface of the potting material 4 remote from the main body 23 may be constructed in the manner of a convergent lens or a divergent lens, depending on the intended application of the lens 1.

In the example of FIG. 5A, the surface of the potting material 4 remote from the main body 23 exhibits a concave curvature. FIG. 5B in contrast shows a lens 1 in which the surface of the potting material 4 remote from the main body 23 exhibits a convex curvature.

Thanks to a curvature of the surface of the potting material 4 remote from the main body 23, it is possible to achieve predetermined, in particular desired, light guidance in this zone of the lens 1. In particular, radiation may, for example, be made to converge or diverge in zones.

Our lens, components and methods are not limited to the examples as a result of the description made with reference thereto, but instead this disclosure encompasses any novel feature and any combination of features, including, in particular, any combination of features in the appended claims, even if the feature or combination is not itself explicitly indicated in the claims or examples.

The invention claimed is:

1. An optoelectronic component comprising:
    a lens comprising a single-pieced, optically homogeneous and transparent main body comprising a first major face, a second major face and at least one cavity arranged on the first major face and which is formed in a transparent main body, and a potting material arranged in the cavity and comprising at least one diffuser which scatters radiation of at least one wavelength range, and
    at least one light source comprising a semiconductor body with an active layer, wherein
    1) the light source is arranged on a side of the first major face,
    2) the light source is arranged outside the cavity of the main body,
    3) the light source is arranged at a distance from the lens and from the potting material,
    4) a lateral extent of the cavity is less than a lateral extent of the active layer from a top view onto a radiation exit side of the semiconductor body,
    5) radiation emitted by the light source which enters the main body of the lens through the first major face is i) guided without scattering processes in the lens to the second major face and emerges from the lens at the second major face, and ii) in areas outside the cavity directly comes from the light source and does not pass through the potting material, and
    6) radiation emitted by the light source which enters the potting material at the first major face is i) scattered in the potting material and is then guided in the main body to the second major face, where it emerges from the lens, and ii) in areas of the cavity directly comes from the light source and does not pass through the main body.

2. The optoelectronic component according to claim 1, wherein the first major face exhibits a curvature at least in places.

3. The optoelectronic component according to claim 1, wherein the potting material ends flush with the first major face.

4. The optoelectronic component according to claim 1, wherein the second major face comprises outcoupling structures.

5. The optoelectronic component according to claim 4, wherein the outcoupling structures are roughened portions of the second major face.

6. The optoelectronic component according to claim 1, wherein the main body comprises at least one reflective subzone.

7. The optoelectronic component according to claim 1, wherein the main body is constructed at least in places as a Fresnel lens.

8. The optoelectronic component according to claim 7, wherein a first step of the Fresnel lens forms the cavity.

9. The optoelectronic component according to claim 1, wherein the potting material is epoxy resin.

10. A method of producing the optoelectronic component according to claim 1, comprising:
- providing the light source and the lens such that the cavity is arranged on the first major face, and the potting material is arranged in the cavity,
- the light source is arranged on a side of the first major face,
- the light source is arranged outside the cavity of the main body,
- the light source is arranged at a distance from the lens,
- the lateral extent of the cavity is less than a lateral extent of the light source,
- the radiation emitted by the light source which enters the main body of the lens through the first major face is guided without scattering processes in the lens to the second major face and emerges from the lens at the second major or face, and
- the radiation emitted by the fight source which enters the potting material at the first major face is scattered in the potting material and is then guided in the main body to the second major face, where it emerges from the lens, and
- introducing the potting material into the cavity with dispensing system.

11. The method according to claim 10, wherein the temperature of the potting material during dispensing is below the melting temperature of material forming the main body.

12. The optoelectronic component according to claim 1, wherein
1) the main body and the potting material directly adjoin one another so that there is no space or gap at a boundary surface between the main body and the potting material,
2) a proportion of the lens made up by the potting material is no more than 10 percent,
3) the main body of the lens comprises silicone, epoxide or a mixture of silicone and epoxide, and
4) the potting material is arranged between the light source and the main body.

13. The optoelectronic component according to claim 1, wherein the main body contains at least one converter that converts blue light emitted by the light source into light of another wavelength so that the optoelectronic component emits white mixed radiation.

* * * * *

UNITED STATES PATENT AND TRADEMARK OFFICE
CERTIFICATE OF CORRECTION

| | | |
|---|---|---|
| PATENT NO. | : 8,848,297 B2 | Page 1 of 1 |
| APPLICATION NO. | : 13/263104 | |
| DATED | : September 30, 2014 | |
| INVENTOR(S) | : Bemmerl et al. | |

It is certified that error appears in the above-identified patent and that said Letters Patent is hereby corrected as shown below:

In the Claims,

In Column 11

At line 18, please change "second major or face" to --second major face--.

Signed and Sealed this
Sixth Day of January, 2015

Michelle K. Lee
*Deputy Director of the United States Patent and Trademark Office*